United States Patent [19]

Czarnul

[11] Patent Number: 4,710,726
[45] Date of Patent: Dec. 1, 1987

[54] SEMICONDUCTIVE MOS RESISTANCE NETWORK

[75] Inventor: Zdzislaw Czarnul, New York, N.Y.

[73] Assignee: Columbia University in the City of New York, New York, N.Y.

[21] Appl. No.: 834,321

[22] Filed: Feb. 27, 1986

[51] Int. Cl.$^4$ .............................................. H03F 1/34
[52] U.S. Cl. .................................... 330/69; 307/568; 328/127; 330/86; 330/107; 330/284; 330/294
[58] Field of Search ............... 330/86, 69, 107, 109, 330/145, 277, 254, 284, 294; 307/264, 304, 568; 328/127; 333/81 R

[56] References Cited

U.S. PATENT DOCUMENTS

| | | | |
|---|---|---|---|
| 3,757,240 | 9/1973 | Fogg | 330/284 X |
| 4,121,183 | 10/1978 | Murphy | 333/81 R |
| 4,275,357 | 6/1981 | Nakayama et al. | 330/107 |
| 4,509,019 | 4/1985 | Banu et al. | 330/107 |
| 4,523,153 | 6/1985 | Itoh | 330/254 |
| 4,559,498 | 12/1985 | Sokoloff | 328/127 |

Primary Examiner—James B. Mullins
Attorney, Agent, or Firm—Brumbaugh, Graves, Donohue & Raymond

[57] ABSTRACT

A circuit useful as a voltage tunable resistive element comprises four matched MOS transistors in which each of the first and second have their drains interconnected to a first input terminal and each of the third and fourth have their drains interconnected to a second input terminal, the first and third have their sources interconnected to a first output terminal and the second and fourth have their sources interconnected to a second output terminal, and the first and fourth have their gates interconnected to a first control terminal and the second and third have their gates interconnected to a second control terminal. A continuous-time integrator is described which includes such a resistive element.

10 Claims, 7 Drawing Figures

SEMICONDUCTIVE MOS RESISTANCE NETWORK

FIELD OF THE INVENTION

This invention relates to semiconductive integrated circuits.

RELATED APPLICATION

Contemporaneously with this application, there is being filed an application by Y. Tsividis which describes related subject matter, which is commonly assigned, and whose Ser. No. is 834,323.

BACKGROUND OF THE INVENTION

In integrated circuits, there frequently arises the need for circuit elements that effectively act as resistance or transresistance elements, particularly such elements that can be voltage-tuned to a prescribed value. Typical of such circuits are continuous-time integrators and continuous-time filters.

A circuit element which has proven attractive for this role has been the familiar MOS transistor, which between its two main current handling electrodes, the source and drain, can be made to exhibit a resistance which is tunable by varying the voltage of its control or gate electrode. One difficulty has been that this resistance tends to be linear over a relatively narrow range of values, which limits its usefulness in some applications, such as in continuous-time integrators and filters.

U.S. Pat. No. 4,509,019 which issued to Banu and Tsividis on Apr. 2, 1985, describes a technique for improving on the basic limitations of the MOS transistor for use as a resistor in particular circuits. This technique capitalizes on the fact that the current of a single transistor may be viewed as comprising to a first order two components, one of which is sensitive to voltage, and so adapted for voltage tuning of its value, and the other of which is relatively independent of the operating voltages, particularly their signs. Moreover, also utilized is the fact that an MOS transistor can be viewed as a conductance, the conductance being the reciprocal of the resistance. From these principles, there is derived, for use as a variable resistance or conductance, a circuit which employs two MOS matched transistors, whose channels are connected in series with the inverting and noninverting inputs, respectively of a balanced twin-output twin output operational amplifier. Equal and opposite voltages are applied in series, respectively, with the two channels of the transistors, and equal voltages are applied to the gate electrodes and substrates of the two transistors. This circuit provides across the two balanced outputs of the amplifier a relatively linear resistance, which is tunable by the voltage applied to the gate electrodes of the transistors. Basically, these result a circuit whose output conductance is the sum only of the voltage sensitive components of the conductances of the two transistors. The voltage-insensitive components of the conductances of the two transistors substantially cancel as a result of subtraction. While this circuit represents an improvement over a single transistor for most applications, it has shortcomings. One is the need for the complexity of a double-input double-output operational amplifier. Another is the need for two well-matched input voltages of opposite polarities. Moreover, in fact the cancellation of the two other components is not complete because of second order effects.

For many applications, these shortcomings are important and the invention is directed at a circuit arrangement which can be free of one or more of these problems, depending on the particular embodiment of the invention chosen.

SUMMARY OF THE INVENTION

A basic feature of the circuit of the instant invention is a novel MOS resistive network which employs four matched MOS transistors, each operating in its non-saturation region, a single operational amplifier with either single-ended or balanced output, and pairs of control terminals, input terminals and output terminals. Each of the first and second transistors has one of its current handling electrodes connected to the same first input terminal, and each of the third and fourth transistors has one of its current handling electrodes connected to the second input terminal. Each of the first and fourth transistors has its control electrode connected to the first of the two control terminals, and each of the second and third transistors has its control electrode connected to the second of the two control terminals. The first and the third transistors each has its other current handling electrode connected by way of one output terminal to one of the two inputs of the operational amplifier and each of the second and fourth transistors has its other current-handling electrode connected by way of the other output terminal to the other input of the operational amplifier. The two input terminals are supplied with voltages which need have no special relationship between them, depending on the application. Similarly the two control terminals are supplied with voltages which are larger than the threshold voltages, which need have no special relationship between them, depending on the application, other than providing that each transistor remains conductive in a non-saturation region of its operating characteristic. These voltages are used to tune the resistance of the network to the desired valve. The operational amplifier may be either of the form having a single output terminal, or of the form having a balanced pair of output terminals, depending on the application.

Moreover, there will be described a number of circuit applications for this novel MOS resistive two-port network (MRTP). It is characteristic of this structure that it uses for each of the two conductances, that are being combined in the operational amplifier to provide the output conductance, hybrid conductances which involve several transistors. As a consequence, there results a differential current which ideally can be free of both even and odd nonlinearities. linearities.

Of special interest is a continuous-time integrator utilizing the novel circuit.

DESCRIPTION OF THE DRAWINGS

The invention will be described with reference to the accompanying drawing in which.

DESCRIPTION OF THE PREFERRED EMBODIMENTS OF THE INVENTION

Figure 1:
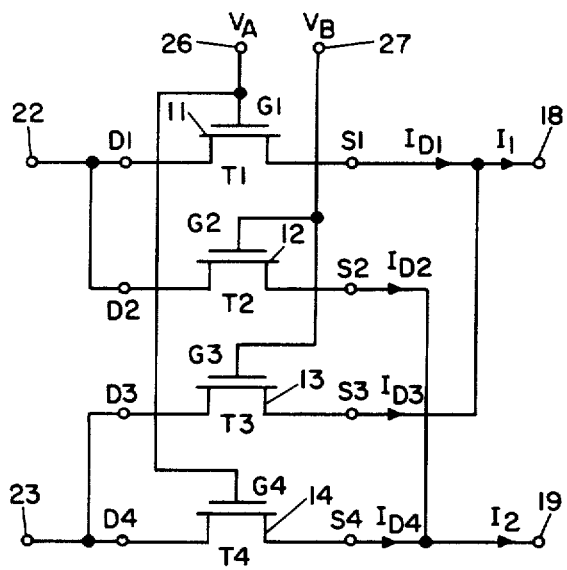
FIG. 1 shows the circuit schematic of the MOS resistive network (MRN) which is the basic feature of the invention.

With reference now to the drawings, FIG. 1 shows the circuit 10 of the MOS transistor resistive network which is the basic feature of the invention. It includes four MOS transistors 11, 12, 13 and 14. Optimum performance is obtained when all four transistors are well matched. Generally the matching between closely-located transistors on the same chip and processed identically is adequate. Advantageously, each is an N-channel enhancement mode device including a pair of current-handling electrodes termed the source and drain, and the gate electrode, which overlies the gate oxide and is used to control the conductance of the induced N-channel which extends between the source and drain regions by controlling the effective depth of the induced channel. In the figure, the source is labeled S, the drain D and the gate G for each transistor. As is known, in the usual form of MOS transistors, the roles of the source and drain are interchangeable and relate simply to the direction of current flow between the two current carrying or handling electrodes, and this interchangeability characterizes this labeling of sources and drains.

The sources of transistors 11 and 13 are connected together and to a first output terminal 18, the sources of transistors 12 and 14 are connected together and to the second output terminal 19. The drains of transistors 11 and 12 are connected together and to the first input terminal 22. The drains of transistors 13 and 14 are connected together and to the second input terminal 23. The gates of transistors 11 and 14 are connected together and to the first control terminal 26. The gates of transistors 12 and 13 are connected together and to the second control terminal 27. The substrates of the transistors are each maintained at a given potential, as is usual in an integrated circuit.

Figure 2:
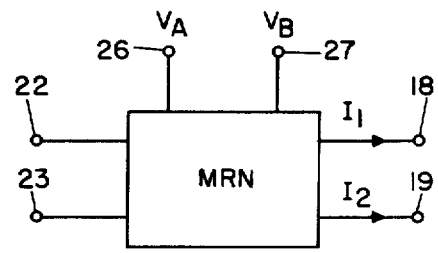
FIG. 2 shows the symbol which will be used for the MRN in several of the following circuit applications in which it is included.

It will later be convenient to use the symbol shown in FIG. 2 MRN in circuit schematics including this novel network, where the terminals 18, 19, 22, 23 and 26, 27 in FIG. 2 correspond to those elements in FIG. 1. Moreover it should be noted that since, as previously mentioned, in the usual form of MOS transistor, the source and drain are interchangeable, in this circuit network the output terminals 18, 19 and input terminals 22, 23 are similarly interchangeable.

If the MOS transistors are chosen to have a long N-channel and to be operated in a non-saturation region, it can be shown that $$I_1 - I_2 = 2K(V_{G1} - V_{G2}) \cdot (V_1 - V_2)$$

where $I_1$ and $I_2$ are the currents flowing out terminals 18, 19, respectively, $V_{G1}$ and $V_{G2}$ are the voltages applied to control terminals 26, 27 respectively, and $V_1$ and $V_2$ are the voltages applied to input terminals 22, 23, respectively, and K is a constant of the transistors, being directly related to the effective mobility of the electrons in the channel, assumed independent of the terminal voltages, the gate oxide capacitance per unit area, the width of the channel and inversely related to the length of the channel. The transresistance of the resistive network 10 which is defined as $$R = \frac{V_1 - V_2}{I_1 - I_2}$$

accordingly satisfies the relationship $$R = \frac{1}{2K(V_{G1} - V_{G2})}$$

From this it appears that the difference $(V_{G1} - V_{G2})$ serves as a constant differential control voltage which can be used to voltage tune the transresistance.

There is also a degree of interchangeability in roles between the gate electrodes and the current-handling electrodes, so that in principle it is feasible to apply tuning voltages to either pair of the latter electrodes instead.

A tunable circuit element of the kind described has a variety of applications. A particularly useful application is for use in a continuous-time integrator that represents an improvement over that described in the aforementioned U.S. patent.

Figure 3:
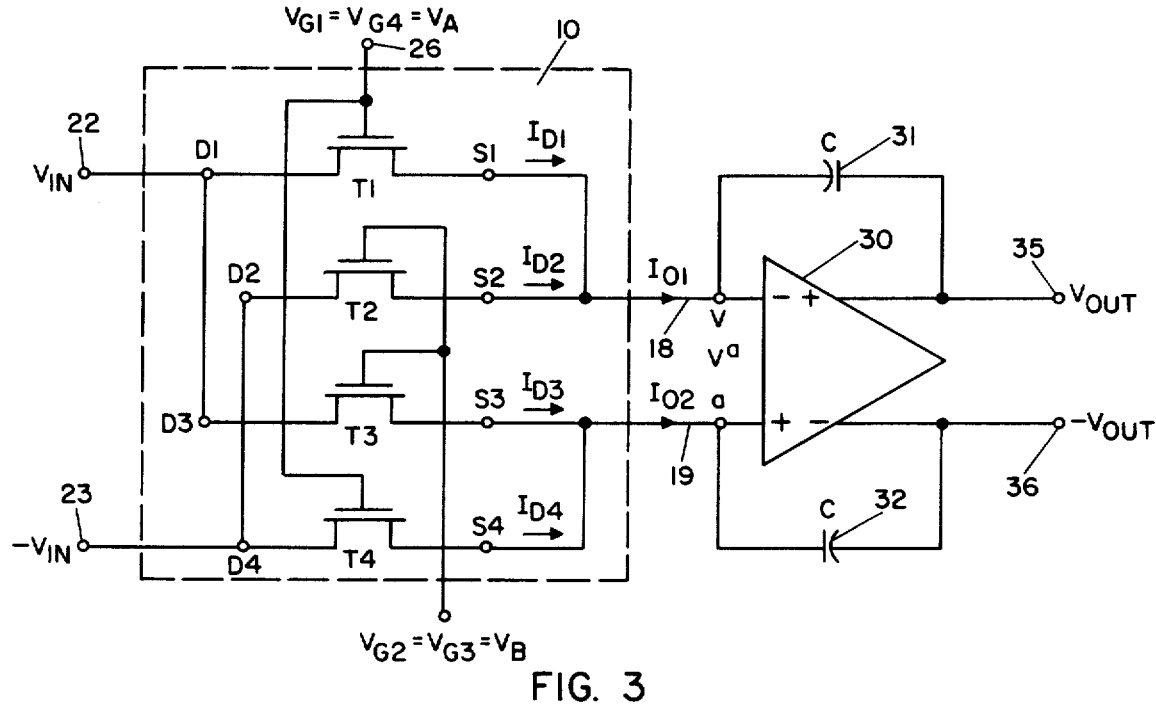
FIG. 3 shows in circuit schematic form a continuous time integrator using an MRN with a balanced twin input twin output operational amplifier.

FIG. 3 shows schematically the resulting improved form. It comprises the MRN 10, whose output terminals 18 and 19 are connected to the inverting and non-inverting terminals, respectively, of the balanced double input-double output operational amplifier 30, whose non-inverting and inverting output terminals are connected by way of equal capacitors 31 and 32 back to the inverting and non-inverting terminals, respectively.

Equal and opposite voltages are applied to the input terminals 22 and 23 of the MRC and equal and opposite voltages are available at the output terminals 35 and 36, that correspond to the inverted and non-inverted outputs of the operational amplifier. The current is controlled by the difference in the voltages applied to the control terminals 26, 27. In practice, one of these voltages can be used for automatic tuning and be provided by an on-chip automatic tuning circuit in known fashion. Such automatic tuning may be useful to compensate for the dependence of carrier mobility on temperature of the circuit assumed to be independent in the analysis.

Figure 4:
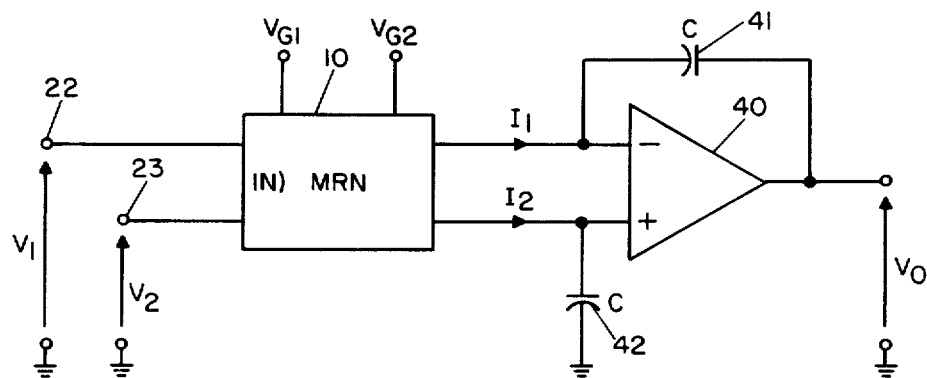
FIG. 4 similarly shows a continuous-time integrator using the MRN with a balanced twin-input single-output operational amplifier.

In FIG. 4 is shown a modified version which employs a simpler single ended operational amplifier. In this circuit, the two output terminals 18, 19 of the MRN are connected to the inverting and inverting input terminals of a single-ended operational amplifier 40 and the output of the amplifier is fed back by way of the capacitor 41 to its inverting input terminal. An equal capacitor 42 is connected between the non-inverting input terminal and ground. An input voltage $V_1$ with respect to ground is supplied to the first input terminal 22 of the MRC and an input voltage $V_2$ with respect to ground is supplied to the second input terminal 23. It can be shown that the output voltage $V_o$ of the integrator satisfies the relation $$V_o = 2K \frac{(V_{G1} - V_{G2})}{C} \int_{\infty}^{t} (V_1 - V_2) \, dt$$

where $V_{G1}$ and $V_{G2}$ are the two voltages applied to the control terminals of the MRN, and $V_1$ and $V_2$ the voltages applied to the input terminals of the MRC, C is the capacitance of the capacitor, and K essentially a parameter of the transistors.

This integrator has the advantage that it can be used to obtain either a non-inverting or an inverting transfer function depending on the voltages applied. If $V_1$ is made equal to 0 and $V_{G1}$ greater than $V_{G2}$, or $V_2$ equal to 0 and $V_{G1}$ less than $V_{G2}$ we have a non-inverting transfer function. If $V_1$ is made equal to 0 while $V_{G1}$ is less than $V_{G2}$ or if $V_2$ is made equal to 0 and $V_{G1}$ greater than $V_{G2}$ an inverting transfer function results.

Additionally, the transfer function does not depend on threshold voltage, and extraneous signals in the substrate do not modulate the value of the time constant. Similarly extranseous signals common to the control voltages cancel out. Moreover the time constant given by $$\frac{C}{2K(V_{G1} - V_{G2})}$$

is voltage-controlled and can be automatically tuned to a predetermined value by an on-chip automatic control circuit in known fashion.

Figure 5:
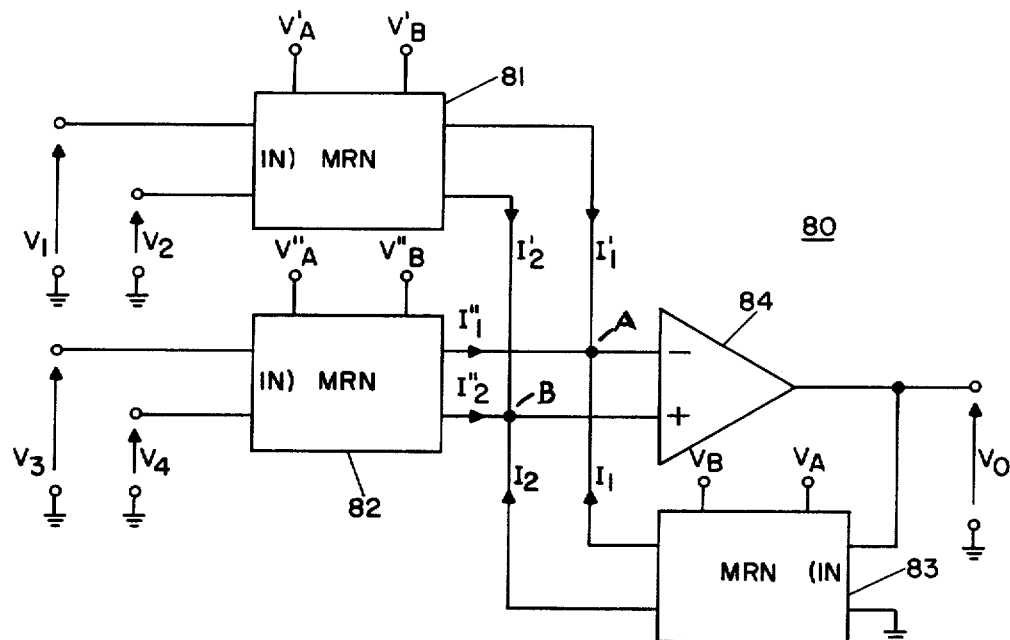
FIG. 5 shows in a circuit schematic form a summer using three MRNs.

FIG. 5 shows a summer circuit 80 employing three MRNs, 81, 82, 83. MRN 81 is supplied at its two input terminals with voltages $V_1$ and $V_2$ respectively and MRN 82 has its two input terminals supplied with voltages $V_3$ and $V_4$, respectively. Each of MRNs 81 and 82 has its two output terminals connected to the two input terminals of the single ended operational amplifier 84, respectively. MRN 83 has one of its inputs connected to the output of amplifier 84 and the other grounded, and its two output terminals are connected to the two input terminals of amplifier 84, respectively. The various difference currents according to the first equation set forth above are given as follows:

$$I_1 - I_2 = 2K(V_{G1} - V_{G2})V_o$$

$$I_1' \, I_2' = 2K'(V_A' - V_B')(V_1 - V_2)$$

$$I_1^{11} - I_2^{11} = 2K^{11}(V_A^{11} - V_B^{11})(V_3 - V_4)$$

where the various currents and voltages are as shown in FIG. 5. Moreover, subtracting the KCL equations for nodes A & B, the two input terminals of the operational amplifier results in the relationship $$-(I_1 - I_2) = (I^1 - I^{11}) + (I_1^{11} - I_2^{11})$$

By manipulation of the above equations, one finds that $$V_o = \frac{K^1}{K} \frac{(V_A' - V_B')^1}{(V_A - V_B)} (V_1 - V_2) - \frac{K^{11}(V_A^{11} - V_B)}{(V_A - V_B)} (V_3 - V_4)$$

Accordingly, the summer is linear and each $(V_1-V_2)$ or $(V_3-V_4)$ component can be tuned independently by single external voltages $V_{G1}^1$ and $V_{G1}^{11}$ if the voltage terminals $V_{G2}^1$ and $V_{G2}^{11}$ are connected to a common potential $V_{G2}$. The factor of each component may take values of any size, positive as well as negative by appropriate choices of the K constants, the control voltages, and the input signals. Although for negative feedback in the operational amplifier, it is required that $V_{G1}$ be greater than $V_{G2}$ the relation between $V_{G1}^1$, $V_{G1}^{11}$, $V_{G2}^1$ and $V_{G2}^{11}$ can be chosen arbitrarily.

Figure 6:
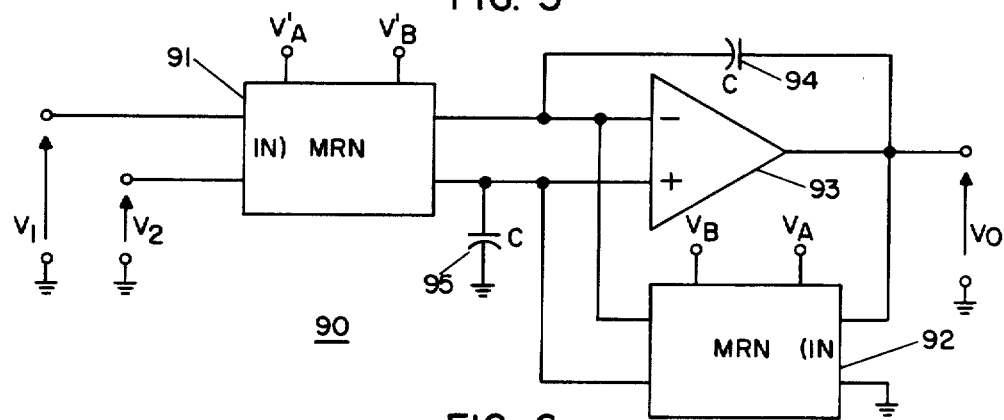
FIG. 6 shows in circuit schematic form a lossy integrator using a pair of MRNs.

In FIG. 6, the lossy integrator 90 utilizes a pair of MRNs 91, 92. This integrator differs from that shown in FIG. 4 by the addition of MRN 92 whose two input terminals are connected to the single-ended output of the operational amplifier 93 and ground, respectively, to feed a portion of the output voltage Vo back across the two input terminals of the operational amplifier 93. The amount of feedback is tuned by the voltages $V_{G1}$, $V_{G2}$ to the control terminals of MRN 92. As in the basic form shown in FIG. 3, MRN 91 has its two output terminals connected to the two input terminals of the operational amplifier, respectively, and capacitors 94 and 95 are connected in the manner of capacitors 31 and 32 in FIG. 3. The previous comments for controlling the various parameters in the integrator and summer circuits are also applicable for the lossy integrator circuit.

Figure 7:
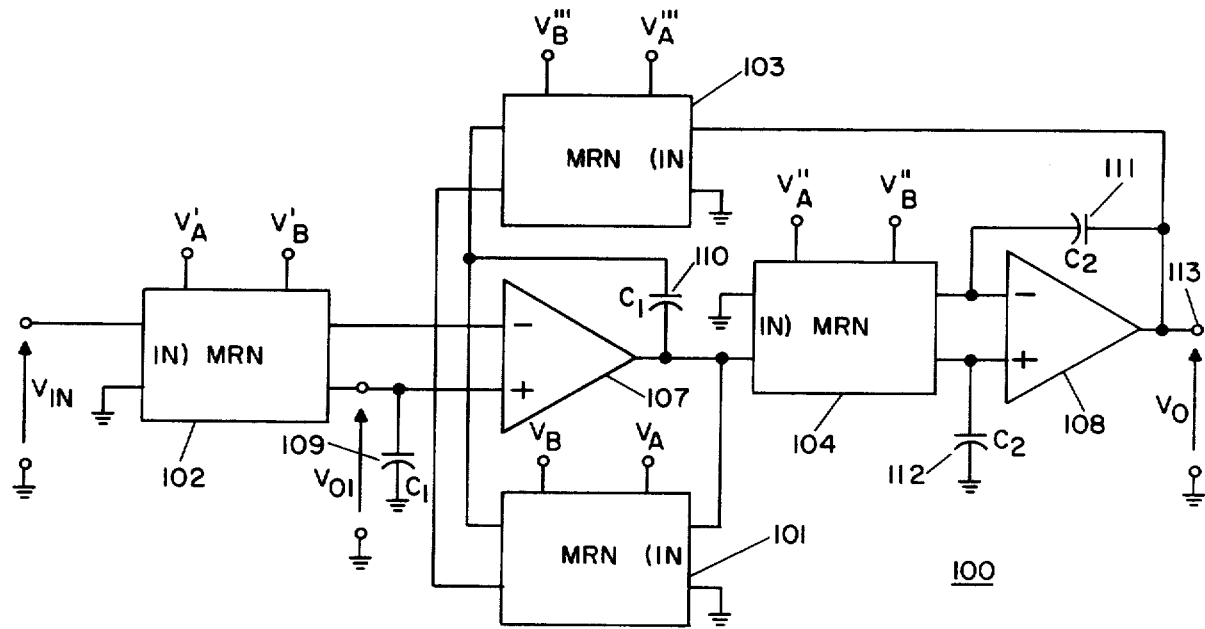
FIG. 7 shows in circuit schematic form a Tow-Thomas type of filter using both the integrator shown in FIG. 4 and the lossy integrator shown in FIG. 6.

An example of a filter 100 design using the basic integrator of FIG. 4 and the lossy integrator of FIG. 5 with identical MOS transistors is shown in FIG. 7. The filter 100 is derived from the known Tow-Thomas filter described in a paper by L. C. Thomas, entitled "The Biquad" which appeared in the IEEE Transactions on CT, 1971, Vol. CT-18, No. 3, pp. 350-361. The filter includes four MRNs 101, 102, 103 and 104 and two single-ended operational amplifiers 107 and 108 and four capacitors 109, 110, 111 and 112. MRN 102 has one of its two input terminals supplied with the input voltage Vin and the other is grounded. Its two output terminals are connected to the two input terminals of operational amplifier 107. Capacitor 109 connects the non-inverting terminal of amplifier 107 to ground. Capacitor 110 equal in capacitance to capacitor 109 feeds the output of the amplifier's single ended output terminal back to its inverting input terminal. MRN 101 has one of its input terminals also connected to the output terminal of the amplifier 107 and its other input terminal grounded. One of the output terminals of MRN 101 is connected to the non-inverting input terminal of amplifier 107 and the other to its inverting input terminal. MRH 104 has one input terminal grounded and the other connected to the output of amplifier 107. The first and second output terminals of MRN 104 supply the inverting and noninverting terminals of the operational amplifier 108, respectively, whose single ended output is connected to the output terminal 113, which is connected to one input terminal of MRN 103, whose other input terminal is grounded. Capacitor 111 feeds the output of amplifier 108 back to its inverting input terminal, and its non-inverting input terminal is connected to ground by way of the capacitor 112, equal in capacitance to capacitor 111. MRN 103 has its first and second output terminals connected to the inverting and non-inverting terminals of amplifier 107.

It is found that the filter shown in FIG. 6 should provide essentially full cancellation of nonlinearities over a wide frequency range.

It should be apparent that on MRN of the kind described can be used in a variety of other applications where its properties are useful.

Moreover as previously mentioned, it is feasible to use the voltages applied to the source or drain electrodes for tuning if this should provide desirable in which case the voltages on the gate electrodes would usually be fixed.

Moreover it should also be apparent that P-channel MOS transistors can be used instead of the N-channel type and the depletion mode form of MOS transistor used instead of the enhancement mode form.

This network is particularly useful where digital and analog circuits are mixed on the same chip since the noise spikes of the digital circuit in the substrate tend to be balanced out in the network.

I claim:

1. A circuit arrangement including a two-port network whose transresistance is voltage-tunable over a linear range and which includes a pair of input terminals, a pair of output terminals, and a pair of control terminals, an input circuit branch connected between the input terminals, and an output circuit branch connected between the output terminals;

the two-port network comprising first, second, third and fourth matched MOS transistor, each having first and second current-carrying electrodes and a control electrode, and capable of operation in a non-saturated condition;

the first current-carrying electrode of each of the first and second transistors being connected to one of the input terminals and the first current-carrying electrode of each of the third and fourth transistors being connected to the other of the input terminals;

the second current-carrying electrode of each of the first and third transistors being connected to one of the output terminals, the second current carrying electrode of each of the second and fourth transistors being connected to the other of the output terminals;

the control electrode of each of the first and fourth transistors being connected to one of the control terminals and the control electrode of each of the second and third transistors being connected to the other of the control terminals; and and voltage means connected to the control terminals for maintaining during operation each transistor continually conductive in a non-saturated region of its transfer characteristic currents whereby the conductances of the transistors may be combined in the output circuit branch.

2. The circuit arrangement of claim 1 in which the output circuit branch is an operational amplifier having an inverting input and a non-inverting input, said said two inputs are connected to respective ones of the two output terminals of the two-port resistive network.

3. The circuit arrangement of claim 2 in which the input circuit branch is designed to supply complementary voltages to respective ones of the two input terminals.

4. A circuit arrangement in accordance with claim 9 for use as a continuous time integrator in which said operational amplifier has a balanced pair of inverting and non-inverting inputs and a balanced pair of inverting and non-inverting outputs, and first and second equal capacitance means interconnect the inverting input to the non-inverting output and the non-inverting input to the inverting output, respectively.

5. A circuit arrangement in accordance with claim 2 for use as a continuous-time integrator in which said operational amplifier has a balanced pair of inverting and non-inverting inputs and a single output and first and second equal capacitance means connect the inverting input to the single output and the non-inverting input to a point of reference potential, repsectively.

6. The circuit arrangement of claim 1 in which the input circuit branch is designed to apply balanced complementary voltages to respective ones of the two input terminals.

7. The circuit arrangement of claim 6 in which the output circuit branch is designed to combine voltages of substantially equal magnitude.

8. A summer circuit comprising three circuit arrangements each including a two-port network whose resistance is voltage-tunable over a linear range and which includes a pair of input terminals, a pair of output terminals, and a pair of control terminals, an input circuit branch connected between the input terminals, and an output circuit branch connected between the output terminals;

the two-port network comprising first, second, third and fourth matched MOS transistors, each having first and second current-carrying electrodes and a control electrode, and capable of operation in a non-saturated condition;

the first current-carrying electrode of each of the first and second transistors being connected to one of the input terminals and the first current-carrying electrode of each of the third and fourth transistors being connected to the other of the input terminals;

the second current-carrying electrode of each of the first and third transistors being connected to one of the output terminals, the second current carrying electrode of each of the second and fourth transistors being connected to the other of the output terminals;

the control electrode of each of the first and fourth transistors being connected to one of the control terminals and the control electrode of each of the second and third transistors being connected to the other of the control terminals;

and voltage means connected to the control terminals for maintaining during operation each transistor conductive in a non-saturated region whereby the conductances of the transistors may be combined in the output circuit branch; and a balanced input-pair single-output operational amplifier whose two inputs are connected to the pair of output terminals of each of the three circuit arrangements and whose single output in connected to one of the input terminals of one of the circuit arrangements, the other of its input terminals being connected to a point of reference potential.

9. A lossy continuous-time integrator comprising two circuit arrangements, each including a two-port network whose resistance is voltage-tunable over a linear range and which includes a pair of input terminals, a pair of output terminals, and a pair of control terminals, an input circuit branch connected between the input terminals, and an output circuit branch connected between the output terminals;

the two-port network comprising first, second, third and fourth matched MOS transistors, each having first and second current-carrying electrodes and a control electrodes, and capable of operation in a non-saturated condition;

the first current-carrying electrode of each of the first and second transistors being connected to one of the input terminals and the first current-carrying electrode of each of the third and fourth transitors being connected to the other of the input terminals;

the second current-carrying electrode of each of the first and third transistors being connected to one of the output terminals, the second current carrying electrode of each of the second and fourth transistors being connected to the other of the output terminals;

the control electrode of each of the first and fourth transistors being connected to one of the control terminals and the control electrode of each of the second and third transistors being connected to the other of the control terminals;

and voltage means connected to the control terminals for maintaining during operation each transistor conductive in a non-saturated region whereby the conductances of the transistors may be combined in the output circuit branch;

a balanced-input pair single-output operational amplifier and a pair of equal capacitances means in which the output terminals of each of the circuit arrangements are connected to the input pair of the operational amplifier and one of the capacitance means is connected between the single output and the inverting input of the operational, amplifier and the other capacitance means is connected between the non-inverting input of the operational amplifier and a point of reference potential; and one input terminal of one of the circuit arrangements is connected to the output of the operational amplifier and its other input terminal is connected to the point of reference potential.

10. A filter comprising first, second, third and fourth circuit arrangements, each including a two-port network whose resistance is voltage-tunable over a linear range and which includes a pair of input terminals, a pair of output terminals, and a pair of control terminals, an input circuit branch connected between the input terminals, and an output circuit branch connected between the output terminals;

the two-port network comprising first, second, third and fourth matched MOS transistors, each having first and second current-carrying electrodes and a control electrode, and capable of operation in a non-saturated condition;

the first current-carrying electrode of each of the first and second transistors being connected to one of the input terminals and the first current-carrying electrode of each of the third and fourth transistors being connected to the other of the input terminals;

the second current-carrying electrode of each of the first and third transistors being connected to one of the output terminals, the second current carrying electrode of each of the second and fourth transistors being connected to the other of the output terminals;

the control electrode of each of the first and fourth transistors being connected to one of the control terminals and the control electrode of each of the second and third transistors being connected to the other of the control terminals;

and voltage means connected to the control terminals for maintaining during operation each transistor conductive in a non-saturated region whereby the conductances of the transistors may be combined in the output circuit branch;

first and second balanced input-pair single-output operational amplifiers, a first pair of equal capacitance means, a second pair of equal capacitance means, and means fixing a point of reference potential in which one of the terminals of the input pair of terminals of each of four circuit arrangements is connected to a point of reference potential, the other terminal of the input pair of terminals of the first circuit arrangement is connected to the input terminal of the filter, the other terminal of the input pair of terminals of the second circuit arrangement is connected to the output of the second amplifier, the other terminal of the first pair of terminals of the third circuit arrangement is connected to the output of the first amplifier, and the other terminal of the input pair of terminals of the fourth circuit arrangement is connected to the output of the first amplifier, the two terminals of the output pair of terminals of the first, second and third circuit arrangements are connected to the balanced pair of inputs of the first amplifier, the terminals of the output pair of terminals of the fourth circuit arrangement are connected to the balanced pair of inputs of the second amplifier;

the first of the two capacitance means of the first pair is connected between the non-inverting input of the first amplifier and said point of reference potential, the second of the two capacitances of the first pair is connected between the output of the first amplifier and its inverting input; and the first of the two capacitances of the second pair is connected between the non-inverting input of the second amplifier and the point of reference potential, and the second of the two capacitances of the second pair is connected between the output of the second amplifier and its inverting input, and the output of the second amplifier is the output terminal of the filter.

* * * * *

UNITED STATES PATENT AND TRADEMARK OFFICE
CERTIFICATE OF CORRECTION

PATENT NO. : 4,710,726
DATED : December 1, 1987
INVENTOR(S) : Zdzislaw Czarnul

It is certified that error appears in the above-identified patent and that said Letters Patent is hereby corrected as shown below:

Column 1, line 49, "output twin output" should read --input twin-output--;
Column 1, line 57, after "result" insert --in--;
Column 2, line 40, "valve" should be --value--;
Column 2, line 53, delete "linearities.";
Column 3, line 63, "I" should be --$I_1$--;
Column 5, line 17, "extranseous" should be --extraneous--;
Column 6, line 63, "on" should be --an--;
Column 6, line 68, "provide" should be --prove to be--;
Column 7, line 41, delete "and";
Column 7, line 49, after "input," "said said" should read --and said--;
Column 7, line 56, "claim 9" should read --claim 2--;
Column 8, line 2, "repsectively" should read --respectively--;
Column 8, line 47, "in" should be --is--; and
Column 8, line 62, "electrodes" should read --electrode--.

Signed and Sealed this

Seventh Day of June, 1988

Attest:

DONALD J. QUIGG

Attesting Officer

Commissioner of Patents and Trademarks